US007205918B2

(12) United States Patent
Niederdränk et al.

(10) Patent No.: US 7,205,918 B2
(45) Date of Patent: Apr. 17, 2007

(54) HEARING AID DEVICE WITH AN OUTPUT AMPLIFIER HAVING A SIGMA-DELTA MODULATOR

(75) Inventors: Torsten Niederdränk, Erlangen (DE); Peter Nikles, Erlangen (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 0 days.

(21) Appl. No.: 11/355,664

(22) Filed: Feb. 15, 2006

(65) Prior Publication Data

US 2006/0192692 A1 Aug. 31, 2006

(30) Foreign Application Priority Data

Feb. 15, 2005 (DE) ..................... 10 2005 006 858

(51) Int. Cl.
*H03M 3/00* (2006.01)

(52) U.S. Cl. ....................... 341/143; 341/144; 341/118

(58) Field of Classification Search ................ 341/118, 341/119, 143, 144, 152, 155; 381/313, 324; 330/10, 251
See application file for complete search history.

(56) References Cited

U.S. PATENT DOCUMENTS 5,617,058 A * 4/1997 Adrian et al. ................. 330/10
6,271,780 B1 * 8/2001 Gong et al. ................. 341/139
6,373,334 B1 * 4/2002 Melanson .................... 330/10
6,466,679 B1 * 10/2002 Husung ...................... 381/324
6,539,096 B1 * 3/2003 Sigwanz et al. ............ 381/313
6,605,991 B2 * 8/2003 Midya et al. ................. 330/10
6,639,531 B1 * 10/2003 Melanson ................... 341/143
6,765,436 B1 * 7/2004 Melanson et al. ............ 330/10
6,812,758 B2 * 11/2004 Gauthier et al. ............ 327/157
6,933,778 B2 * 8/2005 Olson et al. .................. 330/10
2001/0040621 A1 * 11/2001 Albinet ....................... 341/152
2002/0057808 A1 * 5/2002 Goldstein ................... 381/106
2003/0081803 A1 5/2003 Petilli et al.
2005/0030093 A1 * 2/2005 Olson et al. .................. 330/10

* cited by examiner

*Primary Examiner*—Linh Nguyen
(74) *Attorney, Agent, or Firm*—Schiff Hardin LLP

(57) ABSTRACT

In a digital hearing aid device with an output amplifier having a sigma-delta modulator, the output transducer has a high current consumption even when no output signal perceivable as an acoustic output signal is generated. A linear digital filtering in connection with the sigma-delta modulation reduces the number of the high-frequency edges in the (typically) pulse-density-modulated output signal.

15 Claims, 2 Drawing Sheets

HEARING AID DEVICE WITH AN OUTPUT AMPLIFIER HAVING A SIGMA-DELTA MODULATOR

BACKGROUND OF THE INVENTION

1. Field of the Invention

The present invention concerns a hearing aid device of the type having an input transducer for acquisition of an input signal and conversion into an electrical signal, an A/D converter for conversion of the electrical signal into a digital signal, a signal processing unit for processing and amplification of the digital signal, a sigma-delta modulator for generation of at least one output bit stream, an output stage for generation of an electrical output signal and an output transducer for conversion of the electrical output signal into an output signal perceivable by a user.

2. Description of the Prior Art

In modern digital audio apparatuses, a component known as a sigma-delta modulator is used for conversion of digital signals into analog signals to activate a speaker or earphone. These sigma-delta converters transform the digital signal representation into a bit stream, which directly represents the acoustic output signal. Since the individual output bits of this output signal are output with a high rate, analog filtering typically must ensue for limitation to the required audio frequency range in order to keep the higher-frequency interference signals away from the speaker.

The speaker used in hearing aid devices, which speaker is typically called as earpieces and normally operates according the magnetic principle. Hearing device earpieces inherently exhibit a strong low-pass characteristic. In hearing aid devices with a sigma-delta modulator, the analog filtering of the output signal can be omitted. Due to the high system clock frequency of a sigma-delta modulator, its energy consumption is, however, quite high, which is disadvantageous for use in hearing aid devices. The argument against the selection of a lower (and thus more advantageous in terms of energy) system clock frequency is that the system noise would increase with such a lower frequency.

A hearing device is known from United States Patent Application Publication No. 2003/0081803 A1 in which a sigma-delta modulator generates an output bit stream with the three states +1, 0, −1. This bit stream is supplied to an output stage in the form of an H-bridge that delivers an output signal for direct activation of the earpiece. A circuit that initially, periodically converts the sigma-delta-modulated data stream from each value different from 0 to the 0-state is located between the sigma-delta modulator and the H-bridge. Overall energy is thereby taken from the output signal, so the system noise is also reduced. Disadvantages of this technique are that the non-linearities are generated as well as signal deformation.

A hearing aid device with a microphone, a transfer characteristic component for signal processing, and an output amplifier (which is essentially formed of a sigma-delta converter, a clock pulse generator and a low-pass filter) is known from EP 0 793 897 B1.

A sigma-delta modulator to which an FIR filter is connected is known from EP 0 815 651 B1.

SUMMARY OF THE INVENTION

An object of the present invention is to provide a hearing aid device with an output amplifier that has a sigma-delta modulator via which the energy consumption of the hearing aid device as well as the system noise is reduced.

This object is achieved in an hearing aid device in accordance with the invention having an input transducer for acquisition of an input signal and conversion into an electrical signal, an A/D converter for conversion of the electrical signal into a digital signal, a signal processing unit for processing and amplification of the digital signal, a sigma-delta modulator for generation of at least one output bit stream, an output stage for generation of an electrical output signal; an output transducer for conversion of the electrical output signal into an output signal that can be perceived by a user, and a linear digital filter connected between the sigma-delta modulator and the output stage, such that three different voltage states can be generated at the output of the linear digital filter and at the output of the output stage.

The linear digital filter according to the invention is a linear system in the mathematical sense that converts an input sequence into an output sequence. The linear digital filter used in connection with the invention is also frequency-selective, such that specific frequency components are passed through and other frequency components are suppressed. The “Return to Zero” circuit known from the cited publication US 2003/0081803 A1 is neither linear nor frequency-selective. The circuit used therein, moreover, is not a digital filter.

The invention offers the advantage that the energy consumption of the total system can be reduced by the linear digital filter. In particular the number of the high-frequency edges in the typical pulse-density-modulated output signal is reduced. The system noise also can be reduced at least in a specific frequency range by the frequency-selectivity of the filter. Moreover, interference signals caused by the sigma-delta modulator can be frequency-selectively reduced by the linear digital filter.

DESCRIPTION OF THE PREFERRED EMBODIMENTS

Figure 1:
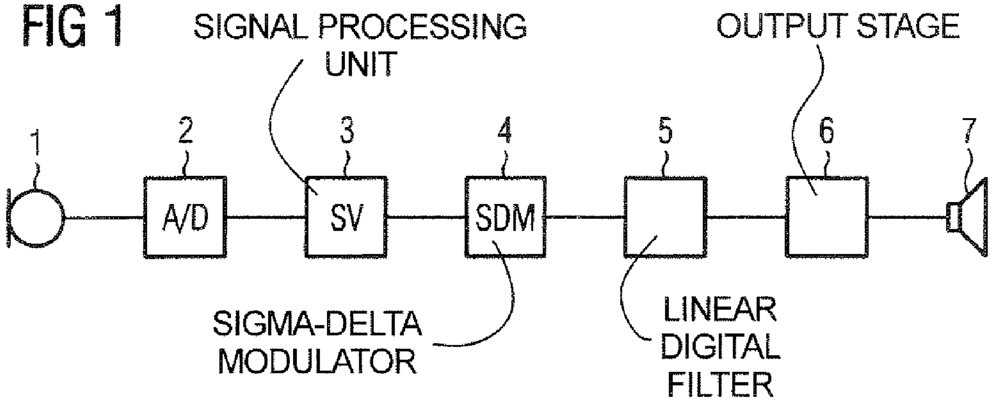
FIG. 1 shows the signal path in a hearing aid device with a linear digital filter according to the invention.

FIG. 1 shows the signal path of a hearing aid device between an input transducer and an output transducer. An input signal is acquired by the input transducer and converted into an electrical signal. At least one microphone 1 that acquires an acoustic input signal typically serves as the input transducer. Modern hearing aid devices frequently have a microphone system with a number of microphones in order to achieve a reception dependent on the incident direction of acoustic signals (a directional characteristic). The input transducer alternatively can be fashioned as a telephone coil or an antenna for acquisition of electromagnetic input signals. In a digital hearing aid device, the input signals converted into electrical input signals by the input transducer (the microphone 1 in the exemplary embodiment) are initially converted into a digital signal by an A/D converter 2, and this digital signal is supplied to a signal processing unit 3 for further processing and amplification.

The further processing and amplification normally ensues dependent on the signal frequency, to compensate the individual hearing loss of a hearing aid device user. The signal filterings typical in hearing aid devices thus occur in the signal processing unit 3. In digital hearing aid devices, the conversion of the digital output signal of the signal processing unit 3 into a signal that can be supplied to the output transducer typically ensues via a sigma-delta modulator 4 that normally emits a pulse-density-modulated signal. In a digital hearing aid device, the output signal is conventionally initially supplied to an output stage 6 and from this directly to an output transducer fashioned as an earpiece 7. Low-pass filtering of the output signal supplied to the earpiece 7 is normally not required since the earpiece 7 already exhibits a strong low-pass characteristic anyway. Nevertheless, it is possible that an analog low-pass filter for suppression of high-frequency signal portions is connected upstream from an output transducer 7, in particular when an earpiece (typically used) is not used as an output transducer. Namely, other types of output transducers in hearing aid devices are known, for example for generation of mechanical oscillations that directly excite specific parts of the ear (such as, for example, the ossicles) to oscillations or that directly stimulate nerve cells of the ear. Normally, however, digital filter means have not been used between the sigma-delta modulator 4 and the output stage 6 so far. In contrast to a, linear digital filter is provided in this segment of the signal path of the hearing aid device according to the invention. This serves to reduce the number of high-frequency edges in the typically pulse-density-modulated output signal of the sigma-delta modulator 4.

The input signal in the filter 5 is a single bit stream. A higher-order encoding of the output signals can be used as an output signal over both earpiece feed lines. In particular three different states, for example “1,0” (1st state), “0,0” (2nd state), “0,1” (3rd state), are realized by two output signal lines of the filter 5.

Figure 2:
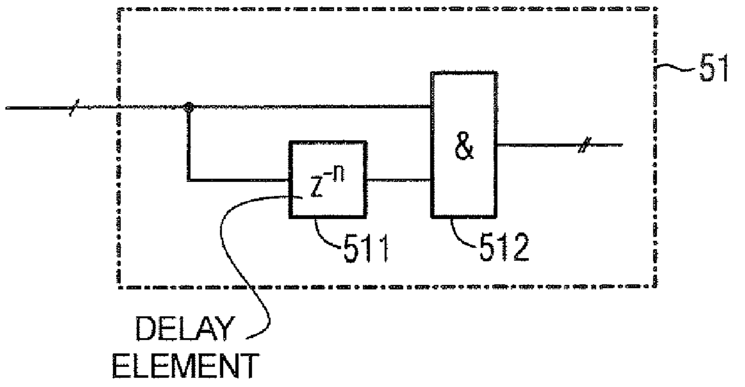
FIG. 2 shows a first embodiment of a linear digital filter used in connection with the invention.

FIG. 2 shows a first and very simple embodiment of the linear digital filter 5 that is designated as a filter unit 51. At its input, the filter unit 51 receives a 1-bit data stream that is directly supplied to the first input of an adder 512 as well as to the second input of the adder 512 after a delay produced by a delay element 511. In the simplest case, a signal delay by one clock pulse ensues in the delay element 511, but a delay of a higher number of clock pulses (generally by “n” clock pulses) can also ensue.

The output signal of the filter unit 51 can have the numerical values 0, 1 or 2. It is accordingly a 2-bit signal. The output stage 6 for impedance conversion can thereby be selected such that, upon application of a “2” (thus the voltage states “1, 0” at both output signal lines), coil current flows through the exciter coil of the earpiece 7 in one direction, upon application of a “1” (thus the voltage states “0, 1” at both output signal lines) coil current flows through the exciter coil in the opposite direction, and upon application of a “0” (thus the voltage states “0, 0” at both output signal lines) the exciter coil is not excited. Given this approach, the low-current effect caused by the filter can also be easily illustrated. Namely, if no signal is present at the input transducer (for example at the microphone 1 according to FIG. 1), the sigma-delta modulator 4 supplies an output signal with a 1-bit output which changes between 0 and 1 with the clock frequency with which the sigma-delta modulator 4 is operated. This in turn causes a high current consumption of the earpiece 7, although its membrane experiences nearly no deflection in this state. It is different in the invention, where in this state a “0” is always present at the input of the output stage 6 and the coil of the earpiece 7 is thereby not excited. Thus no current consumption by the earpiece 7 occurs.

It is noted that the three logical count values “0”, “1”, “2” only represent three different output states of the linear digital filter 5. Naturally, these could be designated otherwise, for example 0, 0.5, 1 or −1, 0, +1. These three output states are converted in the output stage 6 such that the positive input voltage of the earpiece 7, the negative input voltage of the earpiece 7 or no voltage is applied via the exciter coil of the earpiece 7.

In a further embodiment of the invention, the filter is a filter unit 52A with a delay element 521 and a change-over switch 522. An input bit stream in the filter unit 52A is directly supplied to a first input of the change-over switch 522 and, on the other hand, supplied to a second input of the change-over switch 522 through a delay element 521. The delay in the delay element 521 generally ensues by “m” clock pulses, whereby m is a natural number. The change-over switch 522 switches between both inputs with the clock frequency T, whereby T is a multiple of the clock frequency with which the sigma-delta modulator is operated. The filter unit 52A serves for conversion of an input bit stream into an output bit stream, in that a specific frequency is suppressed dependent on the delay due to the delay element 521. A notch filter is accordingly realized by the filter unit 42A. It can be shown that the filter 52A, like the filter 51, is a linear filter.

Given the use of the filter 52A in the signal path of a hearing aid device according to FIG. 1, two similar filters 52A and 52B are advantageously connected in parallel, whereby a filter unit 52 results. The filter unit 52 thereby converts a two-bit input signal into a two-bit output signal. The filter unit 52 can thus be directly connected to a filter 51 according to FIG. 2. Moreover, it is possible to connect a number of filters 52 directly in series, one after the other. By the selection of different signal delays, a number of notches (in particular a number of closely adjoining notches) can then be generated. It is thus possible to suppress frequency ranges in the output signal.

Figure 4:
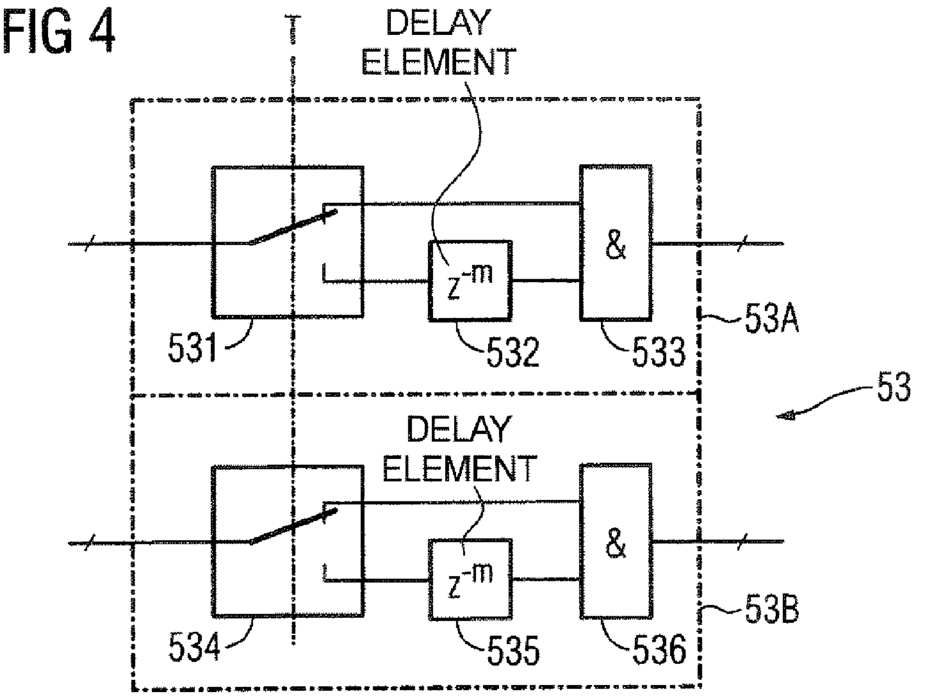
FIG. 4 shows a third embodiment of a linear digital filter used in connection with the invention.

FIG. 4 shows a further embodiment of a digital filter according to the invention. The filter unit 53A has a change-over switch 51, a delay element 532 and an adder 533. An input bit stream into the filter unit 53A is supplied to the output of the change-over switch 531. The first output of the change-over switch 531 is directly supplied to the second input of the adder 533 with the first input of the adder 533 and the second output of the change-over switch 531 through the delay element 532. This filter unit 53A also converts an input bit stream into an output bit stream and, dependent on the signal delay in the delay element 532, generates a notch at a specific signal frequency.

Figure 3:
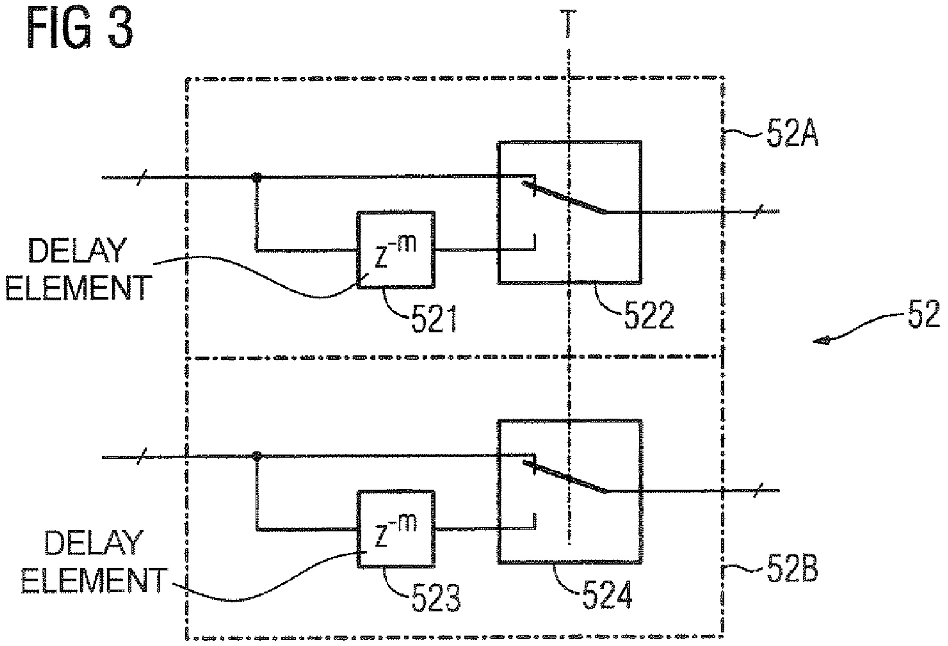
FIG. 3 shows a second embodiment of a linear digital filter used in connection with the invention.

Just as in the filter 52 according to FIG. 3, here two similar filters 53A and 53B complement one another to form a filter 53, since it converts a two-bit input stream into a two-bit output stream. The filter 53 can also be directly connected to a filter 51 according to FIG. 2 and, if applicable, multiple filters 53 can be connected in series.

Figure 5:
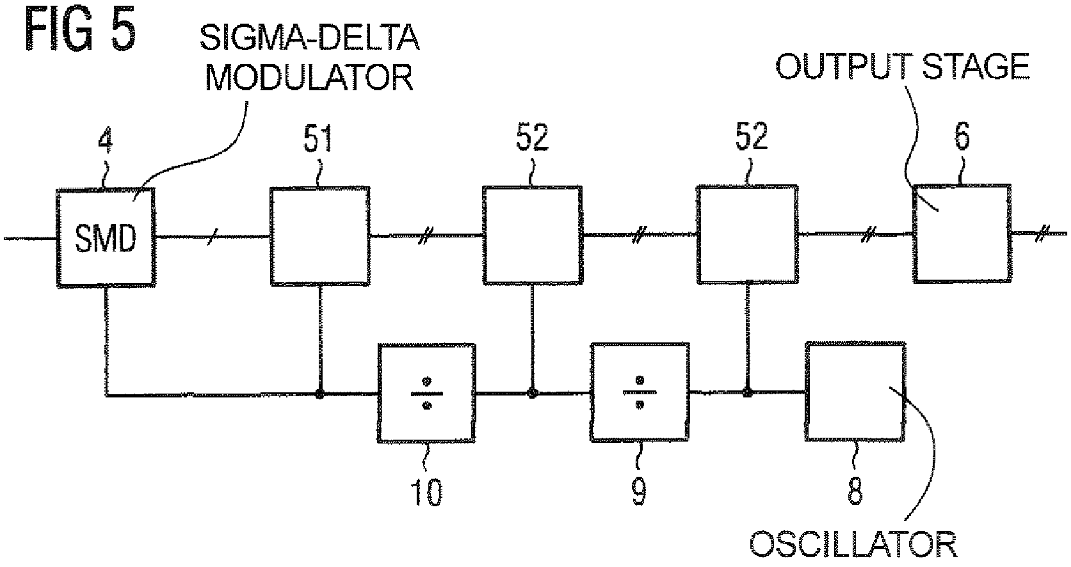
FIG. 5 shows a linear digital filter according to the invention that includes both a first filter and second filter.

The exemplary embodiment according to FIG. 5 shows a section of the signal path of a hearing aid device between a sigma-delta modulator 4 and an output stage 6 between which filter means 51 and 52 according to FIGS. 2 and 3 are present. A one-bit output signal of the sigma-delta modulator 4 forms the input signal in the filter unit 51. The two-bit output signal arising from this serves as an input signal to a first filter unit 52. A further filter unit 52 is in turn connected downstream from this. Its output signal is in turn supplied to the output stage 6. The first filter unit 52 is clocked at twice the clock frequency of the sigma-delta modulator, and the second filter unit 52 is clocked at four times the clock frequency of the sigma-delta modulator. In the exemplary embodiment, this is achieved by the clock pulse generated by an oscillator 8 being halved in each of dividers 9 and 10.

By means of the filter units 51 and 52, multiple notches are generated that serve for suppression of interference signals that, for example, are caused by the sigma-delta modulator 4. The filter in particular serves for reduction of electromagnetic interference radiation that is emitted via the earpiece coil. Furthermore, the reduction of the number of high-frequency edges in the typical pulse-density-modulated output signal of the filter units 51 and 52 leads to a reduced current consumption of the output transducer.

Although modifications and changes may be suggested by those skilled in the art, it is the intention of the inventors to embody within the patent warranted hereon all changes and modifications as reasonably and properly come within the scope of their contribution to the art.

We claim as our invention:

1. A hearing aid device comprising:
- an input transducer that acquires an incoming audio signal and converts said incoming audio signal into an analog electrical signal;
- an analog-to-digital converter supplied with said analog electrical signal that converts said analog electrical signal into a digital signal;
- a signal processing unit supplied with said digital signal that processes and amplifies said linear digital signal to produce a processed signal;
- a sigma-delta modulator supplied with said processed signal that generates at least one output bit stream from said processed signal;
- a linear digital filter connected following said sigma-delta modulator and supplied with said at least one output bit stream therefrom, said linear digital filter having at least one output at which three different voltage states can be generated by filtering said at least one output bit stream; and
- an output stage connected following said linear digital filter that generates a humanly perceivable audio output from the output of said linear digital filter.

2. A hearing aid device as claimed in claim 1 wherein said linear digital filter comprises a delay element and an adder, said adder having a first input directly supplied with said at least one output bit stream from said sigma-delta modulator and a second input supplied with said at least one output bit stream from said sigma-delta modulator after passing through said delay element, said adder having an adder output forming said at least one output of said linear digital filter.

3. A hearing aid device as claimed in claim 2 wherein said sigma-delta modulator is operated with clock pulses, and wherein said delay element delays said at least one output bit stream from said sigma-delta modulator by n clock pulses, wherein $n \geqq 1$.

4. A hearing aid device as claimed in claim 1 wherein said linear digital filter comprises a delay element and a changeover switch, said changeover switch having a first input directly supplied with said at least one output bit stream from said sigma-delta modulator and a second input supplied with said at least one output bit stream from said sigma-delta modulator after passing through said delay element, said changeover switch having a switch output forming said at least one output of said linear digital filter.

5. A hearing aid device as claimed in claim 4 wherein said sigma-delta modulator is operated with clock pulses, and wherein said delay element delays said at least one output bit stream from said sigma-delta modulator by m clock pulses, wherein $m \geqq 1$.

6. A hearing aid device as claimed in claim 4 wherein said clock pulses have a clock frequency, and wherein said changeover switch is clocked to alternatingly connect said first and second inputs thereof to said switch output with a multiple of said clock frequency.

7. A hearing aid device as claimed in claim 6 wherein said multiple of said clock frequency is twice said clock frequency.

8. A hearing aid device as claimed in claim 4 wherein said sigma-delta modulator generates at least two output bit streams, and wherein said delay element and said changeover switch form a filter unit, and wherein said linear digital filter comprises at least one further filter unit, identical to said filter unit, connected in parallel with said filter unit, said filter unit and said at least one further filter unit being respectively supplied with different ones of said at least two output bit streams from said sigma-delta modulator, and the respective outputs of the respective changeover switches in the filter unit and the at least one further filter unit forming respective outputs of said linear digital filter.

9. A hearing aid device as claimed in claim 1 wherein said linear digital filter comprises a changeover switch having a switch input supplied with said at least one output bit stream from said sigma-delta modulator and having two switch outputs, an adder and a delay element, said adder having a first input directly connected to a first of said outputs of said changeover switch and having a second input connected to a second of said outputs of said changeover switch through said delay element, said adder having an adder output forming said at least one output of said linear digital filter.

10. A hearing aid device as claimed in claim 9 wherein said sigma-delta modulator is operated with clock pulses, and wherein said delay element delays said at least one output bit stream from said sigma-delta modulator by m clock pulses, wherein $m \geqq 1$.

11. A hearing aid device as claimed in claim 9 wherein said clock pulses have a clock frequency, and wherein said changeover switch is clocked to alternatingly connect said first and second input thereof to said switch outputs with a multiple of said clock frequency.

12. A hearing aid device as claimed in claim 11 wherein said multiple of said clock frequency is twice said clock frequency.

13. A hearing aid device as claimed in claim 9 wherein said sigma-delta modulator generates at least two output bit streams, and wherein said changeover switch, said delay element and said adder form a filter unit, and wherein said linear digital filter comprises at least one further filter unit, identical to said filter unit and connected in parallel with said filter unit, said filter unit and said at least one further filter unit being respectively supplied with different ones of said at least two output bit streams from said sigma-delta modulator, and the respective outputs of the respective adders in said filter unit and said at least one further unit forming respective outputs of said linear digital filter.

14. A hearing aid device as claimed in claim 1 wherein said sigma-delta converter generates at least two output nit streams and wherein said linear digital filter comprises:
- a filter unit comprising a delay element and an adder, said adder having a first input directly supplied with one of said output bit streams from said sigma-delta modulator and a second input supplied with said one of said output bit streams from said s sigma-delta modulator after passing through said delay element, said adder having an adder output;

at least one further filter unit connected in parallel with said filter unit, said at least one further filter unit comprising a delay element and a changeover switch, said changeover switch having a first input directly supplied with another of said output bit streams from said sigma-delta modulator and a second input supplied with said another of said output bit streams from said sigma-delta modulator after passing through said delay element, said changeover switch having a switch output; and said adder output of said filter unit and said switch output of said further filter unit forming respective outputs of said linear digital filter.

15. A hearing aid device as claimed in claim 1 wherein said sigma-delta converter generates at least two output nit streams and wherein said linear digital filter comprises:

a filter unit comprising a delay element and an adder, said adder having a first input directly supplied with one of said output bit streams from said sigma-delta modulator and a second input supplied with said one of said output bit streams from said s sigma-delta modulator after passing through said delay element, said adder having an adder output;

at least one further filter unit connected in parallel with said filter unit, said at least one further filter unit comprising a changeover switch having an input supplied with another of said output bit streams from said sigma-delta modulator and having two switch outputs, a further adder and a further delay element, said further adder having a first input directly connected to a first of said outputs of said changeover switch and having a second input connected to a second of said outputs of said changeover switch through said further delay element, said further adder having a further adder output; and said adder output of said filter unit and said further adder output of said further filter unit forming respective outputs of said linear digital filter.

* * * * *